March 25, 1969 H. C. JOSEPHS ET AL 3,434,893

SEMICONDUCTOR DEVICE WITH A LATERAL RETROGRADED PN JUNCTION

Filed June 28, 1965

INVENTORS
HAROLD C. JOSEPHS
JAMES D. ZOOK
BY Robert O. Vidas
ATTORNEY

United States Patent Office 3,434,893
Patented Mar. 25, 1969

3,434,893
SEMICONDUCTOR DEVICE WITH A LATERAL RETROGRADED PN JUNCTION

Harold C. Josephs, Plymouth, and James David Zook, Burnsville, Minn., assignors to Honeywell Inc., Minneapolis, Minn., a corporation of Delaware Filed June 28, 1965, Ser. No. 467,236
Int. Cl. H01l 7/34
U.S. Cl. 148—33 3 Claims

ABSTRACT OF THE DISCLOSURE

A semiconductor device having a lateral retrograded PN junction at the surface thereof with a regular PN junction within the bulk portion of the body. The device in the preferred embodiment is formed by a combination of diffusion and alloying.

Figure 1:
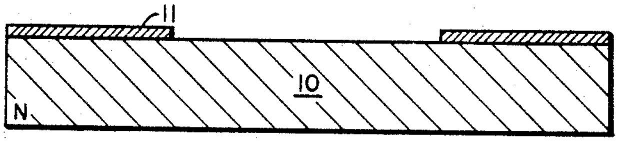

The present invention is directed to semiconductor devices and is more specifically directed to junction containing devices. Even more specifically, the present invention is directed to retrograded junctions and to the method of producing same.

PN junction devices have found wide commercial acceptance in diodes, transistors, and many related devices. By junctions is meant the transition region existing between a semiconductive body of negative conductivity type and a semiconductor body of so called positive conductivity type. A number of different techniques have been used in the formation of such junctions including diffusion, alloying, growing of crystals from the melt, and the like. The characteristics of the PN junctions produced also have a wide variety of characteristics. When the semiconductive material on each side of the specific junction is very heavily doped with an impurity material and has a very abrupt transition from one conductivity type to the other one has a degenerate junction useful in the production of tunnel diodes. In another more common type of junction there is a body of semiconductor material of a first level of doping of a first conductivity type on one side of the junction and a region of the opposite conductivity type material on the other side of the junction which has been produced either by diffusion or by alloying techniques. In this forward graded type of junction the semiconductor material on either side of the junction is graded in concentration level to become less and less concentrated with the impurity type as the junction is approached until finally the impurity levels of negative and positive conductivity type are equal.

The present invention is directed to what has become known as a retrograded junction. By a retrograded junction it is meant that at least a portion of the semiconductor material on one side of the junction in contact therewith goes from a region of relatively low conductivity to increasingly high conductivity as the junction is approached—the direct opposite to that described above for a forward graded junction. Retrograded junctions of this type have found use in the production of variable capacitors (Varactors). One common technique for the production of such retrograded junctions has been to simultaneously diffuse into a semiconductive body of one conductivity type both N and P type impurities simultaneously. In this technique use is made of the differential rates of diffusion of the two source impurities into the body to produce both the junction and the desired retrograded characteristics. Such an arrangement is useful in producing retrograded junctions which extend horizontally into the body of semiconductor material. However, insofar as is known to us no one has produced a retrograded junction wherein the junction is lateral to the surface of the semiconductor device. Such an arrangement is particularly desirable in the production of various photosensitive type devices.

The present invention will be best understood from a study of the following specification and drawing wherein—

Figure 2:
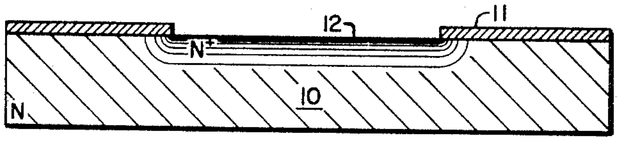
Figure 3:
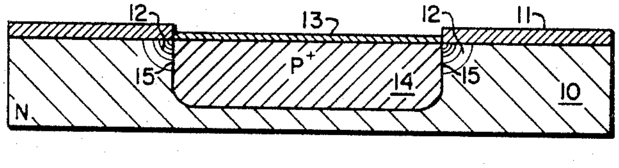
Figure 4:
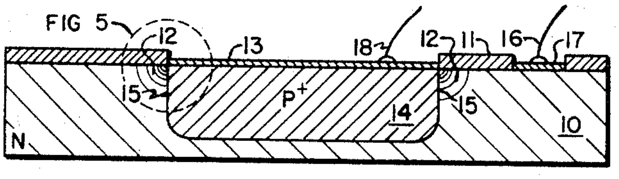
Figure 5:
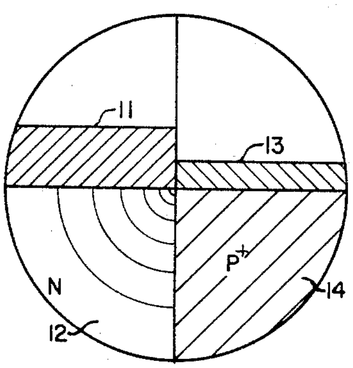

FIGURES 1 through 4 show a sectional and schematic view of the production of a lateral retrograded junction in accordance with the present invention; and FIGURE 5 is a detailed view of a portion of the retrograded junction as shown in FIGURE 4.

The descriptive matter which follows will be given primarily with regard to the production of the retrograded junction of the invention in a silicon body. However, it should be understood that this is for simplicity of illustration only and that the invention is equally applicable to the other semiconductor materials such as germanium. Likewise, in the description of the device of FIGURES 1 through 4 the discussion will be limited to specific impurity causing agents. However, these are not intended to be limiting and various other impurity causing agents can be substituted in accordance with well known doping principles of the semiconductor art. Further, the relationship of the conductivity types may be reversed from the specific example given. That is where a P type material or impurity is indicated it can be N type and vice versa.

Turning now to FIGURE 1 there is illustrated in section a body of N type semiconductor material 10 with a crystal orientation of (111) having produced on a portion of the surface thereof a layer of oxide material 11 leaving a part of the silicon exposed. The N type semiconductive material may be (although is not limited to) 5 ohm centimeter material. The oxide layer 11 may be produced by a number of different techniques. Its function is to act as a mask for the application of impurity materials to the semiconductive body. While the silicon dioxide specifically disclosed is the most widely used material for diffusion masking it should be appreciated that other materials can be used as the mask.

In FIGURE 2 there is illustrated the device of FIGURE 1 following a diffusion of an impurity material such as phosphorous through the opening in oxide film 11. This diffusion is accomplished in the manner well known in the transistor and diode art by depositing a phosphorous containing material on the surface of the semiconductor and then heating at an elevated temperature (about 1100° C.) for an extended period of time. The depth to which the phosphorous will penetrate the silicon body is dependent on its time of exposure to elevated temperatures as well as on the initial concentration of the phosphorous containing substance on the surface. In FIGURE 2 a diffused region 12 has been shaded in a manner to indicate the concentration level of the phosphorous within the diffused region. The closer together the shading lines are the higher the concentration of the phosphorous diffused in the body. As can be seen, the concentration diminishes as the extent of penetration into the body increases. Attention is particularly drawn to the fact that the diffusion not only proceeds vertically into the body but also proceeds in a lateral direction under the oxide layer 11 to a lateral distance equivalent to the depth of penetration vertically into the body.

In FIGURE 3 the unit in accordance with FIGURE 2 has been further processed through the addition of a layer of aluminum 13. The aluminum in turn has been alloyed with the semiconductive body 10. In the instance of alloying the penetration of the impurity is substantially vertical into the body and does not extend laterally to any degree under the oxide layer. The alloying is continued so as to entirely penetrate through the original diffused region 12. The alloying produces a highly doped P type region 14 which cuts across layer 12 to produce PN junctions 15.

Depending on the quantity of aluminum used in producing the alloyed region there may be a depression of the semiconductor surface under the aluminum. That is, silicon is soluble to a small degree in aluminum and this solubility will result in a permanent removal of a part of the silicon (in semiconductor form) that underlies the aluminum. This has not been indicated on the figures.

In FIGURE 4 an additional hole 16 has been opened through oxide layer 11 and a contact 17 provided through the hole in the oxide to the original body of semiconductor material 10. A lead connection 18 has also been provided to the aluminum metal overlying the P+ region 14.

Depending on the ultimate use of the retrograded junction of the present invention, it may be deemed desirable to expose both sides of the retrograded junction to incident light or other radiation. This can readily be accomplished by selectively etching the aluminum to expose the underlying surface of the semiconductor, using the same masking and photoresist technique that was used to produce the hole in the oxide. The negative of the mask used to produce the original opening in the oxide coating can be used.

In FIGURE 5 there is shown a blown up view of a portion of the retrograded junction of FIGURE 4. Region 12 of the original diffusion again has graded spacing between the shading lines to indicate the general nature of the decrease in concentration of the impurity element away from the original junction of oxide 11 and the surface of the semiconductor material 10 at the original opening in the oxide. As can be seen, the junction is retrograded in a lateral manner along the surface of the semiconductor body. This provides the retrograded junction of the invention. As one examines the nature of the junction appearing deeper within the body of semiconductor material it is seen to no longer possess the properties of the retrograded junction but rather the properties of an ordinary junction used in the common diode. This is not harmful in the present invention as when the junction is back biased the desired retrograded junction phenomena will override any effects noticed by the parallel junction of the common type.

Numerous other variations will suggest themselves to the reader.

Having described our invention we claim:

1. A device having a lateral retrograded PN junction comprising:

(a) a body of semiconductor material of a high resistivity first conductivity type, said body having a surface region (b) a first region of opposite conductivity type in a portion of the surface region of said body, said region in PN junction forming relationship with said body along a plane substantially parallel to said surface (c) a second region of said first conductivity type surrounding at least a portion of the perimeter of said first region at said surface region and having a high conductivity portion in junction forming arrangement with said first region; said second region diminishing in concentration of conductivity causing impurity along the surface of the body away from said junction thereby forming a retrograded PN junction.

2. A device having a lateral retrograded PN junction comprising:

(a) a body of silicon semiconductor material of high resistivity first conductivity type, said body having a surface region (b) a first region of opposite conductivity type in a portion of the surface region of said body, said region in PN junction forming relationship with said body along a plane substantially parallel to said surface (c) a second region of said first conductivity type surrounding at least a portion of the perimeter of said first region at said surface and having a high conductivity portion thereof in junction forming arrangement with said first region, said second region diminishing in concentration of conductivity causing impurity along the surface away from said junction thereby forming a retrograded PN junction.

3. A device having a lateral retrograded PN junction comprising:

(a) a body of N-type high resistivity silicon semiconductor material having a surface region (b) a first region of P-type conductivity in a portion of the surface region of said body said region in PN junction forming relationship with said body along a plane substantially parallel to said surface (c) a second region of N-type conductivity surrounding at least a portion of the perimeter of said first region at said surface and having a high conductivity portion thereof in junction forming arrangement with said first region, said second region diminishing in concentration of N-type causing impurity along the surface of the body away from said junction thereby forming a retrograded PN junction.

References Cited

UNITED STATES PATENTS

| | | | |
|---|---|---|---|
| 3,338,758 | 8/1967 | Tremere | 317—235 |
| 3,264,707 | 8/1966 | Elie | 136—89 |
| 3,149,395 | 9/1964 | Bray | 148—175 |
| 3,226,614 | 12/1965 | Haenichen | 148—187 |
| 3,341,381 | 9/1967 | Bergman | 148—187 |

HYLAND BIZOT, *Primary Examiner.*

U.S. Cl. X.R.

148—187; 136—189; 317—234